United States Patent [19]

Hagino

[11] Patent Number: 4,667,242

[45] Date of Patent: May 19, 1987

[54] AUTOMATIC GAIN CONTROL CIRCUIT

[75] Inventor: Hideyuki Hagino, Fukaya, Japan

[73] Assignee: Kabushiki Kaisha Toshiba, Kawasaki, Japan

[21] Appl. No.: 874,392

[22] Filed: Jun. 16, 1986

[30] Foreign Application Priority Data

Jun. 28, 1985 [JP] Japan .................................. 60-140563

[51] Int. Cl.⁴ .............................................. H04N 5/52
[52] U.S. Cl. ..................................................... 358/174
[58] Field of Search ............... 358/174, 176, 178, 179, 358/184

[56] References Cited

U.S. PATENT DOCUMENTS 3,569,620  3/1971  Baun ...................................... 358/174
4,204,229  5/1980  Heuze ................................... 358/174

OTHER PUBLICATIONS

"Electrical/Electronics Engineering Encyclopedia" vol. 25, Nov. 1983, pp. 318–319, Editor: Shigeo Tsuji.

Primary Examiner—Tommy P. Chin
Attorney, Agent, or Firm—Oblon, Fisher, Spivak, McClelland & Maier

[57] ABSTRACT

An automatic gain control (AGC) circuit for performing an AGC for a picture signal. The AGC circuit includes an amplifier for amplifying the picture signal, a clamping circuit for fixing a tip-end level of a synchronous signal component of the picture signal, a synchronous detection AGC loop constituted of the amplifier, the clamping circuit, a synchronous detection circuit and a first filter, a peak detection AGC loop constituted of the amplifier, the clamping circuit, a peak detection circuit and a second filter, and a precharging means connected between the first filter and the second filter for charging the second filter by a voltage followed to a voltage charged on the first filter when the synchronous detection AGC loop is activated but the peak detection AGC loop is deactivated.

7 Claims, 3 Drawing Figures

AUTOMATIC GAIN CONTROL CIRCUIT

BACKGROUND OF THE INVENTION

1. Field of the Invention

The present invention relates to an automatic gain control (AGC) circuit, and more particularly, to an AGC circuit suitable for a television receiver, a video tape recorder or a video disc player.

2. Description of the Prior Art

FIG. 1 is a block diagram showing an example of a conventional AGC circuit. An input picture signal 100a is amplified by an amplifier 1 and resulted to an output picture signal 100b with an AGC as described in detail later. Output picture signal 100b is not only introduced to an output terminal 8, but also applied to a clamping circuit 2. In clamping circuit 2, a tip-end level of a synchronous signal component of the output picture signal 100b is clamped to a predetermined fixed voltage and resulted to a tip-end clamped picture signal 200. Clamped picture signal 200 outputted from clamping circuit 2 is applied to a synchronous detection circuit 3 and a peak detection circuit 4; respectively. Synchronous detection circuit 3 detects a pedestal level of the clamped picture signal 200 by a synchronous or keyed detection in the reference of the tip-end level of the synchronous signal component under a synchronization of a verst signal. While peak detection circuit 4 detects a peak level of the picture signal by a peak detection in the reference of the tip-end level of the synchronous signal component. First level signal 300a thus detected by synchronous detection circuit 3 is smoothed by a first filter 5 and resulted to a first AGC signal 400a. First AGC signal 400a is applied to a control terminal of amplifier 1 for controlling the gain of amplifier 1. As a result, output picture signal 100b with synchronous detection AGC is obtained an output terminal 8 as mentioned before. In the synchronous detection AGC, an amplitude of the synchronous signal component in the picture signal 100a is controlled so as to keep in constant.

On the other hand, second level signal 300b thus detected by peak detection circuit 4 is also smoothed by a second filter 6 and resulted to a second AGC signal 400b. Second AGC signal 400b is applied to the control terminal of amplifier 1 through a buffer 7 for controlling the gain of amplifier 1. As a result, output picture signal 100b with peak detection AGC is obtained an output terminal 8 as also mentioned before. In the peak detection AGC, an amplitude of the picture signal 100a is controlled so as not to exceed a predetermined amplitude.

In the AGC circuits, synchronous detection circuit 3 makes a synchronous detection AGC loop together with amplifier 1, clamping circuit 2, and first filter 5. While peak detection circuit 4 makes a peak detection AGC loop together with amplifier 1, clamping circuit 2, second filter 6 and buffer 7.

In the example of the conventional AGC circuits as described above, the synchronous detection AGC loop operates so as to hold an amplitude of first level signal 300a in a given level so that output picture signal 100b is held its amplitude constant. However, there may happen a problem that the amplitude level of output picture signal 100b exceeds the given level relatively. For overcoming the problem, the peak detection AGC loop operates so as to limit the amplitude level of output picture signal 100b to the given amplitude level. Accordingly, the amplitude level of output picture signal 100b on output terminal 8 is so controlled that its amplitude is limited within the given level, as well as an amplitude of its synchronous signal component is held constant.

By the way, when incorporating the conventional AGC circuit described above in a video tape recorder, the AGC circuit operates for preventing an overmodulation in the video tape recorder. For the overmodulation preventing operation, the AGC circuit is required to have a prompt response. However, in the conventional cirucit shown as in FIG. 1, the AGC circuit fails to prevent promptly the overmodulation. Because second filter 6 has been discharged in 0 volt state during the time when the peak detection AGC loop is deactivated. Therefore, the peak detection AGC loop fails to control immediately amplifier 1 into the peak detection AGC operation state after the peak detection AGC loop has been activated or started. The defect of slow response is extremely inconvenient to the function of preventing the overmodulation described above.

SUMMARY OF THE INVENTION

An object of the present invention is to provide an AGC circuit having a prompt loop response characteristic.

Another object of the present invention is to provide an AGC circuit which is improved for an overmodulation in a video tape recorder incorporating the AGC circuit.

These and other objects are achieved in the AGC circuit of this invention which includes an amplifier for amplifying the picture signal, a clamping circuit for fixing a tip-end level of a synchronous signal component of the picture signal, a synchronous detection AGC loop constituted of the amplifier, the clamping circuit, a synchronous detection circuit and a first filter, a peak detection AGC loop constituted of the amplifier, the slamping circuit, a peak detection circuit and a second filter and a precharging means connected between the first filter and the second filter for charging the second filter by a voltage followed to a voltage charged on the first filter when the synchronous detection AGC loop is activated but the peak detection AGC loop is deactivated.

Additional object of the present invention will become apparent to persons skilled in the art from a study of the following description and of the accompanying drawings, in which:

BREIF DESCRIPTION OF THE DRAWINGS

DESCRIPTION OF THE PREFERRED EMBODIMENTS INVENTION

Figure 1:
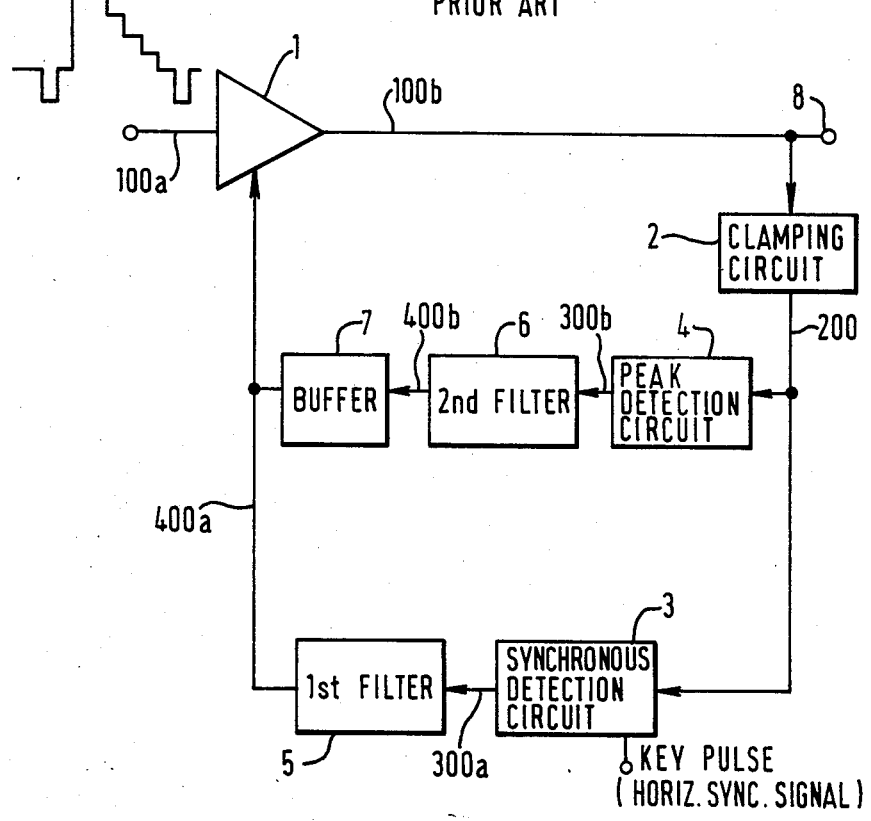
FIG. 1 is a block diagram showing an example of conventional AGC circuits.

The present invention will now be described in detail with reference to the accompanying drawings, namely, FIGS. 2 and 3. Throughout the drawings, like reference numerals and letters are used to designate like or equivalent elements for the sake of simplicity of explanation.

Figure 2:
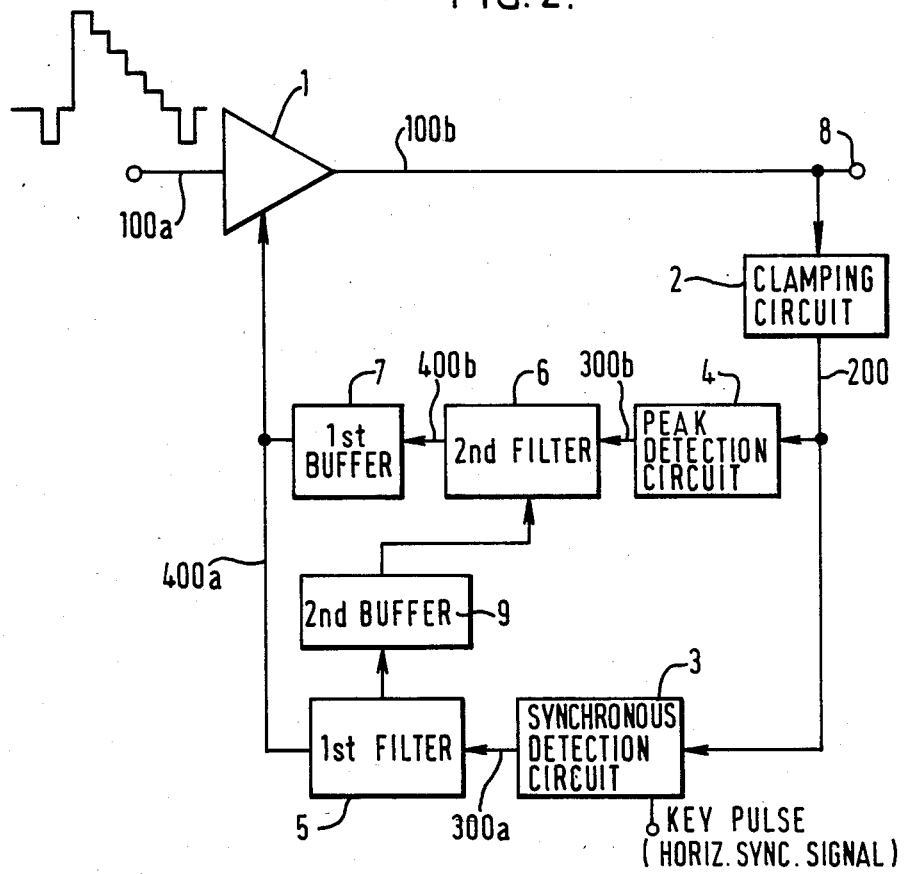
FIG. 2 is a block diagram showing an embodiment of the AGC circuit according to the present invention.

Referring now to FIG. 2, there is shown an example of an AGC circuit according to the present invention.

In FIG. 2, an input picture signal 100a is amplified by an amplifier 1 and resulted to an output picture signal 100b with an AGC as described in detail later. Output picture signal 100b is not only introduced to an output terminal 8, but also applied to a clamping circuit 2. In clamping circuit 2, the level of a synchronous signal contained in output picture signal 100b is clamped to a predetermined fixed voltage and resulted to a clamped picture signal 200. Clamped picture signal 200 outputted from clamping circuit 2 is applied to a synchronous detection circuit 3 and a peak detection circuit 4, respectively. Synchronous detection circuit 3 detects the synchronous signal from tip-end clamped picture signal 200 by a synchronous or keyed detection in which a pedestal level of picture signal 100b is compared with a reference level under a control of some synchronous signal. Synchronous detection circuit 3 constitutes a synchronous detection AGC loop together with clamping circuit 2, a first filter 5 and amplifier 1.

In the synchronous detection AGC loop, synchronous detection circuit 3 detects the synchronous signal from clamped picture signal 200 by a synchronous or keyed detection. First level signal 300a thus detected by synchronous detection circuit 3 is smoothed by first filter 5 and resulted to a first AGC signal 400a. First AGC signal 400a is applied to a control terminal of amplifier 1 for controlling the gain of amplifier 1. As a result, output picture signal 100b with synchronous detection AGC is obtained on output terminal 8 as mentioned before. In the synchronous detection AGC, an amplitude of the synchronous signal compenet in the picture signal 100a is controlled so as to keep in constant.

Peak detection circuit 4 constitutes a peak AGC loop together with clamping circuit 2, a second filter 5, a first buffer 7 and amplifier 1. In the peak AGC loop, peak detection circuit 4 detects the synchronous signal from clamped picture signal 200 by a peak detection. Second level signal 300b thus detected by peak detection circuit 4 is also smoothed by second filter 6 and resulted to a second AGC signal 400b. Second AGC signal 400b is applied to the control terminal of amplifier 1 through first buffer 7 for controlling the gain of amplifier 1. As a result, output picture signal 100b with peak detection AGC is obtained on output terminal 8 as also mentioned before. In the peak detection AGC, an amplitude of the picture signal 100a is controlled so as not to exceed a predetermined amplitude.

Further, first filter 5 is coupled to second filter 6 through a second buffer 9. Then a voltage charged on first filter 5 is applied to second filter 6 through second buffer 9.

Figure 3:
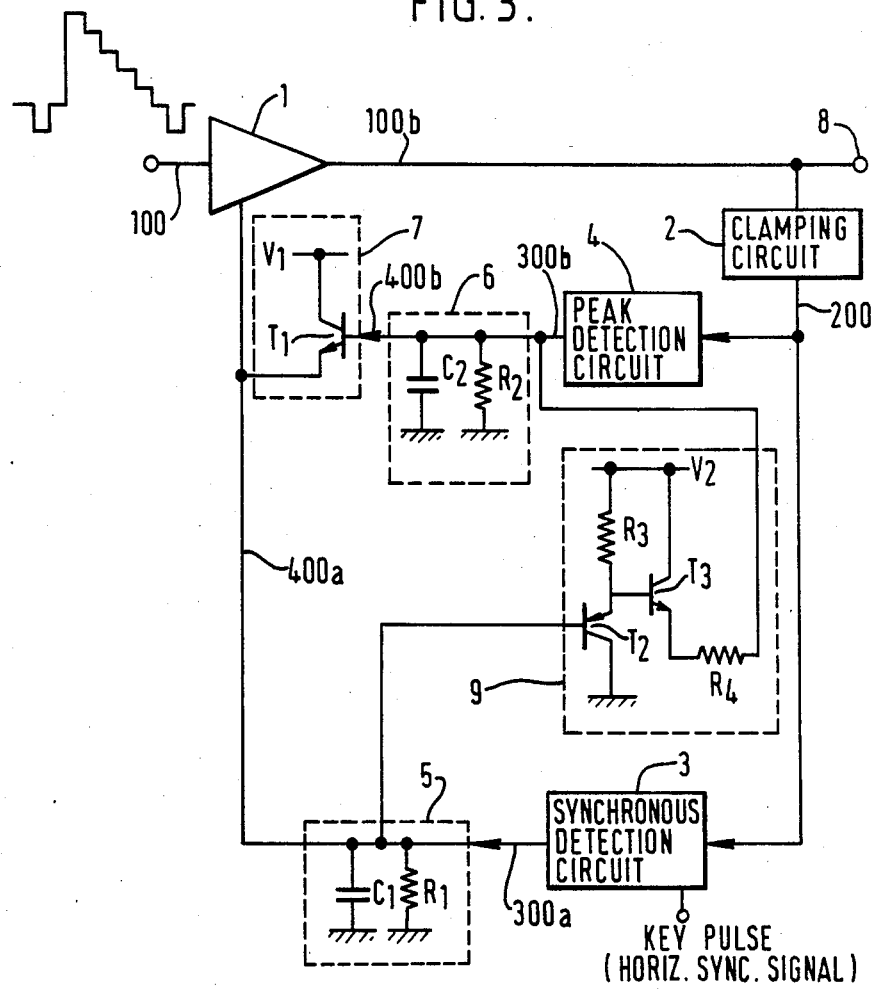
FIG. 3 is a circuit diagram showing in detail the circuit shown in FIG. 2.

Referring now to FIG. 3, the AGC circuit, in perticular, a circuit connection between second buffer 9 and its related circuits and their operations will be described in detail. In FIG. 3, first filter 5, second filter 6, first buffer 7 and second buffer 9 are respectively given with practical circuit arrangements. First filter 5 is constituted of a parallel circuit of a capacitor C1 and a resistor R1, their one ends being connected to synchronous detection circuit 3 while their other ends being earthed. The first connection node of first filter 5 and synchronous detection circuit 3 is coupled to the control terminal of amplifier 1. Second filter 6 is constituted of a parellel circuit of a capacitor C2 and a resistor C2, their one ends being connected to peak detection circuit 4 while their other ends being earthed. The second connection node of second filter 6 and peak detection circuit 4 is coupled to the control terminal of amplifier 1 through first buffer 7. First buffer 7 is constituted of a transistor T1 the base of which is connected to the connection node of peak detection circuit 4 and second filter 6, the emitter is connected to the first connection node, and the collector is connected to a power source line with source voltage V1. Second buffer 9 is provided with transistors T2 and T3. Transistor T2 is connected at its base to the first connection node, at its emitter to a power source line with a source voltage V2 through a resistor R3, and at its collector to the ground potential source. Transistor T3 is connected at its base to the emitter of transistor T2, at its emitter to the second connection node through a resistor R4, and its collector to the power source line with source voltage V2.

The operation of the embodiment will be described below. When the synchronous detection circuit 3 is activated, capacitor C1 in first filter 5 is charged to the output potential of synchronous detection circuit 3 is activated, capacitor C1 in first filter 5 is charged to the output potential of synchronous dectection circuit 3. An emitter potential of transistor T1 in first buffer 7 is risen by the charge voltage on capacitor C1 so as to bias transistor T1 to cut off. Therefore, while the synchronous detection AGC loop is activated, the peak detection AGC loop is deactivated. For this reason, the synchronous detection AGC loop performs its AGC operation described above without being affected by the peak detection AGC loop. Further, at this time, transistor T2 in second buffer 9 is then biased its base potential to the charge voltage of capacitor C1. Therefore, a current responding to the base bias, i.e., the charge voltage flows through transistor T2. For this reason, a current flows also through transistor T3. The current flowing through transister T3 flows into second filter 6 through resistor R4 and charges capacitor C2 in second filter 6. A voltage charged on capacitor C2 is determined by the voltage drop of resistor T4. The charge voltage on capacitor C2 becomes one followed to the charge voltage on capacitor C1 in first filter 5. As the result, while synchronous detection circuit 3 is operated, second filter 6 is charged by the voltage followed to the charge voltage on capacitor C1 in first filter 5. That is, second filter 6 is precharged in spite of the peak detection AGC loop being deactivated.

Therefore, the peak detection AGC loop is able to enter into the peak detection AGC operation state with the prompt response after peak detection circuit 3 is activated. by this loop, the gain of amplifier 1 is promptly controlled for making the amplitude level of the picture signal within the fixed level. Provided, the response time of the synchronous detection AGC loop when the operation of the peak detection AGC loop returns to that of the synchronous AGC loop is determined by the time constant of first filter 5, in similar to a conventional one.

According to the present embodiment, second filter 6 in the peak detection AGC loop is precharged by the voltage followed to the charge voltage on first filter 5 in the synchronous AGC loop, and the responsibility of the peak AGC loop can be improved. Especially, when the AGC circuit according to the present embodiment is used for a VTR and a television receiver, the function for preventing overmodulation can securely be performed.

As described above, the AGC circuit of the present invention has the effect of improving the response in time of the peak detection AGC loop by precharging the filter in the peak detection AGC loop while the synchronous detection AGC loop is operated, in the AGC circuit having a peak detection AGC loop and a synchronous detection AGC loop.

What is claimed is:

1. An automatic gain control (AGC) circuit for performing an AGC for a picture signal, said AGC circuit comprising:
   an amplifier having an input terminal, an output terminal and a control terminal, said amplifier amplifying said picture signal applied to said input terminal under a control of an AGC signal applied to said control terminal;
   a clamping circuit connected to said output terminal of said amplifier for fixing a tip-end level of a synchronous signal component of said picture signal to a given level;
   an synchronous detection AGC loop constituted of said amplifier, said clamping circuit, a synchronous detection circuit connected to said clamping circuit for detecting a pedestal level of said picture signal by asynchronous detection in the reference of said tip-end level of said synchronous signal component, said first filter connected between said synchronous detectin circuit and said control terminal of said amplifier for smoothing said synchronous detection signal from said synchronous detection circuit and applying said control terminal of said amplifier with said smoothed synchronous detection signal as said AGC signal;
   a peak detection AGC loop constituted of said amplifier, said clamping circuit, a peak detection circuit and a second filter, said peak detection circuit connected to said clamping circuit for detecting a peak level of said picture signal by a peak detection in the reference of said tip-end level of said synchronous signal component, said second filter connected between said synchronous detection circuit and said control terminal of said amplifier for smoothing said peak detection signal from said peak detection circuit and applying said control terminal of said amplifier with said smoothed peak detection signal as said AGC signal; and
   means connected between said first filter and said second filter for precharging said second filter by a voltage followed to a voltage charged on said first filter when said synchronous detection AGC loop is activated but said peak detection AGC loop is deactivated.

2. An automatic gain control (AGC) circuit according to claim 1, wherein said precharging means is a buffer means.

3. An automatic gain control (AGC) circuit according to claim 2, wherein said buffer means is constituted of a first and second transistors, said first transistor being connected at it base to said first filter and said second transistor being at its base to the emittrer of said first transistor and at its emitter to said second filter.

4. An automatic gain control (AGC) circuit according to claim 1 further comprising a buffer means connected between said synchronous detection AGC loop and said peak detection AGC loop for deactivating said peak detection AGC loop when said synchronous detection AGC loop is activated.

5. An automatic gain control (AGC) circuit according to claim 4, wherein said buffer means is constituted of a transistor the base of which is connected to said second filter in said peak detection AGC loop while the emitter is connected to said first filter in said synchronous detection AGC loop.

6. An automatic gain control (AGC) circuit according to claim 1 further comprising a first buffer means connected between said synchronous detection AGC loop and said peak detection AGC loop for deactivating said peak detection AGC loop when said synchronous detection AGC loop is activated, wherein said precharging means is a second buffer means.

7. An automatic gain control (AGC) circuit according to claim 6, wherein said first buffer means is constituted of a first trnasistor the base of which is connected to said second filter in said peak detection AGC loop while the emitter is connected to said first filter in said synchronous detection AGC loop and said second buffer means is constituted of a second and third transistors, said second transistor being connected at its base to said first filter and said third transistor being at its base to the emittrer of said second transistor and at its emitter to said second filter.

* * * * *